US006774365B2

(12) United States Patent
Okoroanyanwu et al.

(10) Patent No.: US 6,774,365 B2
(45) Date of Patent: Aug. 10, 2004

(54) SEM INSPECTION AND ANALYSIS OF PATTERNED PHOTORESIST FEATURES

(75) Inventors: Uzodinma Okoroanyanwu, Mountain View, CA (US); Bhanwar Singh, Morgan Hill, CA (US); Alden Acheta, Brentwood, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 452 days.

(21) Appl. No.: 09/820,143

(22) Filed: Mar. 28, 2001

(65) Prior Publication Data

US 2004/0129880 A1 Jul. 8, 2004

(51) Int. Cl.[7] .......................... G01N 23/00; G21K 7/00; H01L 21/302; H01L 21/461
(52) U.S. Cl. ...................... 250/311; 250/306; 250/307; 250/310; 430/296; 430/311; 438/725
(58) Field of Search ................................. 250/306, 307, 250/310, 311; 430/16, 23, 30, 296, 311; 438/623, 701, 725

(56) References Cited

U.S. PATENT DOCUMENTS

| | | |
|---|---|---|
| 3,997,367 A | 12/1976 | Yau |
| 4,394,211 A | 7/1983 | Uchiyama et al. ........... 156/628 |
| 4,446,222 A | 5/1984 | Kress ......................... 430/307 |
| 5,003,178 A | 3/1991 | Livesay .................... 250/492.3 |
| 5,242,864 A * | 9/1993 | Fassberg et al. ............ 438/701 |
| 5,468,595 A | 11/1995 | Livesay |
| 5,510,215 A * | 4/1996 | Prince et al. ................... 430/7 |
| 5,747,803 A * | 5/1998 | Doong ........................ 250/307 |
| 5,783,366 A * | 7/1998 | Chen et al. .................. 430/311 |
| 5,876,903 A | 3/1999 | Ng et al. |
| 5,928,821 A * | 7/1999 | Garrity et al. ................ 430/23 |
| 5,962,195 A | 10/1999 | Yen et al. .................... 430/316 |
| 5,965,461 A | 10/1999 | Yang et al. .................. 438/717 |
| 5,994,225 A | 11/1999 | Liu et al. |
| 6,103,457 A | 8/2000 | Gabriel ........................ 430/318 |
| 6,107,172 A | 8/2000 | Yang et al. .................. 438/585 |
| 6,110,837 A | 8/2000 | Linliu et al. |
| 6,121,130 A * | 9/2000 | Chua et al. .................. 438/623 |
| 6,143,666 A * | 11/2000 | Lin et al. ..................... 438/725 |
| 6,174,818 B1 | 1/2001 | Tao et al. ..................... 438/733 |
| 6,197,687 B1 | 3/2001 | Buynoski |
| 6,200,903 B1 | 3/2001 | Oh et al. ..................... 438/705 |
| 6,232,048 B1 | 5/2001 | Buynoski et al. |
| 6,319,655 B1 | 11/2001 | Wong et al. ................. 430/311 |
| 6,358,670 B1 | 3/2002 | Wong et al. ................. 430/296 |
| 6,395,447 B1 | 5/2002 | Ishii et al. ................... 430/191 |
| 6,420,097 B1 | 7/2002 | Pike et al. ................... 430/313 |
| 6,420,702 B1 * | 7/2002 | Tripsas et al. .............. 250/310 |
| 6,444,381 B1 * | 9/2002 | Singh et al. .................. 430/30 |
| 6,589,709 B1 * | 7/2003 | Okoroanyanwu et al. ... 430/296 |

OTHER PUBLICATIONS

Chiong K.G. et al. "Resist Contrast Enhancement in High Resolution Electron Beam Lithography", Journal of Vacuum Science and Technology: Part B, American Institute of Physics, New York, US, vol. 7, No. 6.

Patent Abstracts of Japan, vol. 1999, No. 09, Jul. 30, 1999 & JP 11 097328 A (Toshiba Corp), Apr. 9, 1999 abstract.

(List continued on next page.)

Primary Examiner—John R. Lee
Assistant Examiner—Mary El-Shammaa
(74) Attorney, Agent, or Firm—Foley & Lardner LLP

(57) ABSTRACT

A process for improving the accuracy of critical dimension measurements of features patterned on a photoresist layer using a scanning electron microscope (SEM) is disclosed herein. The process includes providing an electron beam to the photoresist layer and transforming the surface of the photoresist layer before the SEM inspection. The surface of the photoresist layer is transformed to trap the outgassing volatile species and dissipates built up charge in the photoresist layer, resulting in SEM images without poor image contrast.

20 Claims, 4 Drawing Sheets

OTHER PUBLICATIONS

Livesay, W. R., "*Large–area electron–beam source*," Journal of Vacuum Science & Technology B, vol. 11, No. 6, Nov./Dec. 1993, pp. 2304–2308, American Vacuum Society.

Yang, J. J, et al., "*Electron Beam Processing for Spin–on Polymers and its Applications to Back–End–of–Line (BEOL) Integration*," Materials Research Society Symposium Proceedings, vol. 511, 1998, pp. 49–55, Materials Research Society.

Ross et al, "*Plasma Etch Characteristics of Electron Beam Processed Photoresist*," The Society of Photo–Optical Instrumentation Engineers, vol. 2438, 1995, pp. 803–816, SPIE–The International Society for Optical Engineering.

Grün, Von A. E., "*Lumineszenz–photometrische Messungen der Energieabsorption im Strahtungsteid von Elektronen quellen Eindimensionaler Fall in Luft*," Zeitschrift für Naturforschung, vol. 12a, 1957, pp. 89–95, Publisher: Zeitschrift für Naturforschung: full English Translation attached (11 pgs.).

U.S. patent application Ser. No. 09/819,342, Shields et al., filed Mar. 28, 2001.

U.S. patent application Ser. No. 09/819,343, Gabriel et al., filed Mar. 28, 2001.

U.S. patent application Ser. No. 09/819,344, Okoroanyanwu et al., filed Mar. 28, 2001.

U.S. patent application Ser. No. 09/819,552, Gabriel et al., filed Mar. 28, 2001.

U.S. patent application Ser. No. 09/819,692, Okoroanyanwu et al., filed Mar. 28, 2001.

* cited by examiner

SEM INSPECTION AND ANALYSIS OF PATTERNED PHOTORESIST FEATURES

CROSS REFERENCE TO RELATED APPLICATIONS

The present application is related to U.S. application Ser. No. 09/819,342 by Shields et al., entitled "Process for Forming Sub-Lithographic Photoresist Features by Modification of the Photoresist Surface;" U.S. application Ser. No. 09/819,692 by Okoroanyanwu et al., entitled "Process for Preventing Deformation of Patterned Photoresist Features by Electron Beam Stabilization;" U.S. application Ser. No. 09/819,344 by Okoroanyanwu et al., entitled "Process for Reducing the Critical Dimensions of Integrated Circuit Device Features;" U.S. application Ser. No. 09/819,343 by Gabriel et al., entitled "Selective Photoresist Hardening to Facilitate Lateral Trimming;" and U.S. application Ser. No. 09/819,552 by Gabriel et al., entitled "Process for Improving the Etch Stability of Ultra-Thin Photoresist," all filed on an even date herewith and assigned to the Assignee of the present application.

FIELD OF THE INVENTION

The present invention relates generally to integrated circuits (ICs). More particularly, the present application relates to a method and apparatus for improved scanning electron microscope (SEM) inspection and analysis of patterned photoresist features utilized to fabricate ICs.

BACKGROUND OF THE INVENTION

During integrated circuit (IC) fabrication, various surfaces involved therein are inspected and analyzed for a variety of reasons. For example, the dimensions of features provided on a given surface may be measured and/or their alignment with respect to other features may be analyzed. Features provided on a given surface may be inspected for uniformity, integrity and/or defects. A semiconductor substrate, photoresist feature, or a layer above the semiconductor substrate can be inspected.

The semiconductor substrate or a layer above the semiconductor substrate, collectively, a semiconductor wafer, may be inspected to determine whether further processing should continue, whether the wafer should be discarded, or whether an appropriate corrective measure should be taken before further processing of the wafer continues. In this manner, the likelihood of defects occurring during the IC fabrication process can be decreased or eliminated.

Various techniques can be utilized to inspect and analyze the wafer. Optical microscopes, scanning electron microscopes (SEMs), or laser-based systems may be utilized for inspection and measurement tasks. Some of the tasks require human involvement and others are fully automated so that human involvement is unnecessary.

Layers or surfaces which are present on the wafer only during the IC fabrication process (i.e., layers or surfaces which do not comprise the end product IC) are also commonly inspected. For example, layers of photoresist material can be inspected following development (after-develop-inspection or "ADI") to ensure that the pattern transfer process has been performed correctly and/or that the pattern is within specified tolerances. From such inspection, mistakes or unacceptable process variations associated with the layer of photoresist material can be identified and corrected since the layer of photoresist material has not yet been utilized to produce any physical changes to the wafer itself, such as, by doping, etching, etc. Defective layers of photoresist material can be corrected by stripping and reapplying a new layer of photoresist material on the wafer.

Critical dimensions of patterned features on a layer of photoresist material are commonly measured using an SEM inspection and analysis tool. This measurement task involves obtaining SEM images of the patterned features. The SEM inspection and analysis tool obtains SEM images of a given sample using an inspection electron beam, the inspection electron beam characterized by a low beam current (on the order of pA) and an accelerating voltage of approximately 300–1500 V. The sample is rapidly scanned by the inspection electron beam so as to obtain imaging data but not long enough to intentionally affect the sample.

The SEM inspection and analysis tool includes an electron gun, one or more lens assemblies, and photomultiplier detectors, all within a vacuum environment at approximately $10^{-7}$ Torr. Electrons emitted from the electron gun, i.e., the inspection electron beam, are focused by the lens assemblies to form primary electrons that impinge on a sample to be imaged (e.g., the patterned layer of photoresist material). The interaction of the impinging primary electrons with the surface of the sample causes secondary electrons to be emitted from the sample. The secondary electrons are generated from the top portion of the sample, within a depth of approximately 50–60 Å from the top surface. These secondary electrons are collected by the photomultiplier detectors and comprise the imaging data from which SEM images are generated.

However, when the photoresist material is an organic-based photoresist material, SEM images of features patterned thereon are susceptible to poor image contrast, and this in turn may lead to erroneous critical dimension measurements. SEM images with degraded image contrast are caused by undesirable interaction of the primary electrons with the sample (e.g., the organic-based photoresist material). Instead of merely causing secondary electrons to be emitted from the organic-based photoresist material, the primary electrons may also cause volatile organic species to be emitted or outgassed from the organic-based photoresist material (i.e., the outgassing problem). These volatile organic species interact with and scatter the secondary electrons such that the secondary electrons that are collected by the photomultiplier detectors are distorted imaging data representative of the patterned features on the photoresist material. Consequently SEM images generated therefrom are less than ideal, such as, suffering from degraded image contrast.

Additionally, organic-based photoresist materials have a tendency to build up charge and/or heat from the impinging primary electrons (i.e., the charging and heating problems). Organic-based photoresist materials exhibit insulative properties and can build up charge and/or beat from the beam current of the primary electrons. Because the constituents comprising the organic-based photoresist material have varying insulative properties with respect to each other, charge and/or heat dissipation is also non-uniform and/or insignificant. When excessive charge and/or heat builds up within the material, structural or physical changes can occur such that patterned features may become permanently distorted and damaged. Hence, not only are the SEM images inaccurate but subsequent pattern transfer to underlying layers of the wafer is also adversely impacted. As features are lithographically patterned at ever decreasing dimensions, the outgassing, charging, and/or heating problems associated with SEM imaging of organic-based photoresist surfaces are becoming progressively worse.

Thus, there is a need for improved SEM inspection and analysis of patterned features on a layer of photoresist material. There is a further need for a process for reducing charging and/or heating problems associated with SEM imaging of organic-based photoresist materials. There is still a further need for a process for reducing undesirable outgassing problems associated with SEM imaging of organic-based photoresist materials.

BRIEF SUMMARY OF THE INVENTION

One exemplary embodiment relates to a method of inspecting a surface associated with manufacture of an integrated circuit. The method includes providing an electron beam to the surface, and transforming at least a portion of the surface. The method further includes inspecting the surface using a scanning electron microscope (SEM). The transforming step occurs before the inspecting step.

Another exemplary embodiment relates to a patterned photoresist layer. The layer is configured to facilitate accurate critical dimension measurements of features thereon using a scanning electron microscope (SEM). The layer includes a treated region and an untreated region. The treated region comprises a top surface and side surfaces surrounding the untreated region. The treated region has at least one of a different electrical and material property relative to the untreated region.

Still another exemplary embodiment relates to a process for reducing the build up of at least one of charge, heat, and volatile species in a photoresist layer during scanning electron microscope (SEM) inspection. The process includes exposing the photoresist layer to a flood electron beam, and forming a shell in the photoresist layer in response to the flood electron beam. The photoresist layer includes at least one patterned feature having a top surface, side surfaces, and an untreated portion. The shell is comprised of the top surface and the side surfaces. The shell reduces the build up of at least one of charge, heat, and volatile species associated with at least one feature during SEM inspection.

BRIEF DESCRIPTION OF THE DRAWINGS

The exemplary embodiments will become more fully understood from the following detailed description, taken in conjunction with the accompanying drawings, wherein like reference numerals denote like elements, in which.

DETAILED DESCRIPTION OF THE EXEMPLARY EMBODIMENTS

Figure 1:
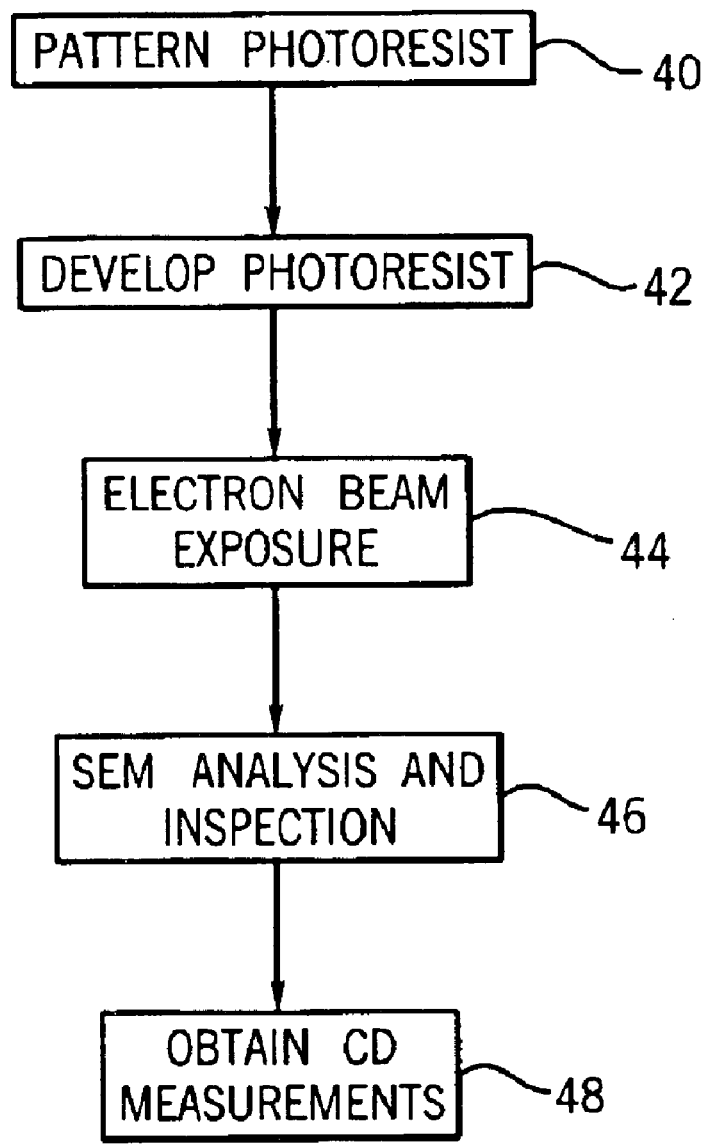
FIG. 1 is a flow diagram showing a process for obtaining accurate critical dimension measurements in accordance with an exemplary embodiment.

In one embodiment of the present invention, an advantageous process for obtaining accurate critical dimension (CD) measurements of features patterned on a photoresist layer during an integrated circuit (IC) fabrication is provided. An exemplary embodiment of the present invention will be described with respect to a flow diagram shown in FIG. 1. The flow diagram includes a patterning step 40, a developing step 42, an electron beam exposure step 44, a scanning electron microscope (SEM) analysis and inspection step 46, and a critical dimension measurements step 48.

Figure 2:
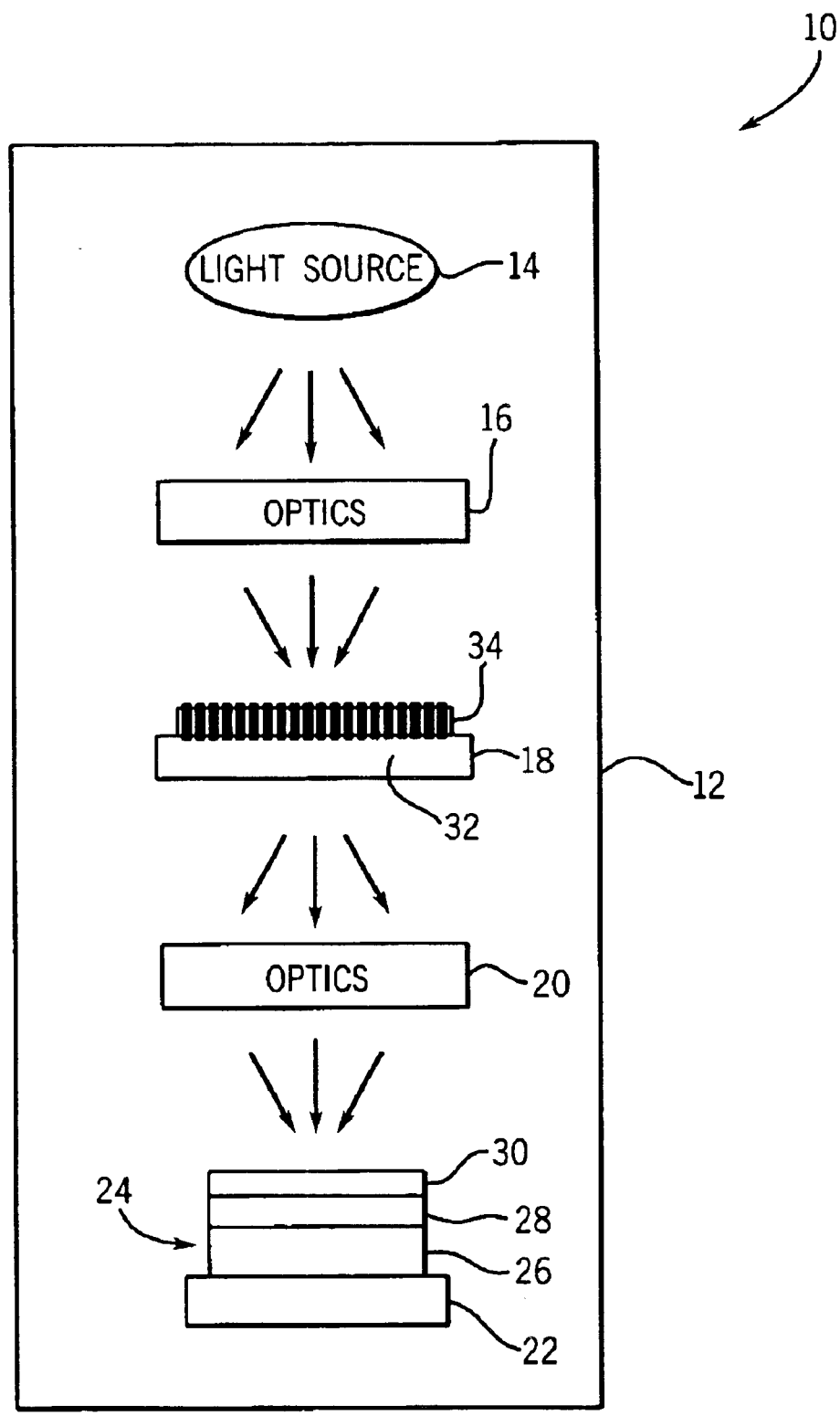
FIG. 2 is a general schematic block diagram of a lithographic system for patterning a wafer in accordance with an exemplary embodiment.

Patterning step 40 is carried out using a lithography system 10, as shown in FIG. 2. Lithographic system 10 includes a chamber 12, a light source 14, a condenser lens assembly 16, a mask or a reticle 18, an objective lens assembly 20, and a stage 22. Lithographic system 10 is configured to transfer a pattern or image provided on mask or reticle 18 to a wafer 24 positioned in lithography system 10. Lithographic system 10 may be a lithographic camera or stepper unit. For example, lithographic system 10 may be a PAS 5500/900 series machine manufactured by ASML, a microscan DUV system manufactured by Silicon Valley Group, or an XLS family microlithography system manufactured by Integrated Solutions, Inc. of Korea.

Wafer 24 includes a substrate 26, a layer 28, and a photoresist layer 30. Photoresist layer 30 is disposed over layer 28, and layer 28 is disposed over substrate 26. Wafer 24 can be an entire integrated circuit (IC) wafer or a part of an IC wafer. Wafer 24 can be a part of an IC, such as, a memory, a processing unit, an input/output device, etc. Substrate 26 can be a semiconductor substrate, such as, silicon, gallium arsenide, germanium, or other substrate material. Substrate 26 can include one or more layers of material and/or features, such as lines, interconnects, vias, doped regions, etc., and can further include devices, such as, transistors, microactuators, microsensors, capacitors, resistors, diodes, etc.

Layer 28 can be an insulative layer, a conductive layer, a barrier layer, or other layer of material to be etched, doped, or layered. In one embodiment, layer 28 can comprise one or more layers of materials, such as, a polysilicon stack comprised of a plurality of alternating layers of titanium silicide, tungsten silicide, cobalt silicide materials, etc. In another embodiment, layer 28 is a hard mask layer, such as, a silicon nitride layer or a metal layer. The hard mask layer can serve as a patterned layer for processing substrate 26 or for processing a layer upon substrate 26. In yet another embodiment, layer 28 is an anti-reflective coating (ARC). Substrate 26 and layer 28 are not described in a limiting fashion, and can each comprise a conductive, semiconductive, or insulative material.

Photoresist layer 30 can comprise a variety of photoresist chemicals suitable for lithographic applications. Photoresist layer 30 is selected to have photochemical reactions in response to electromagnetic radiation emitted from light source 14. Materials comprising photoresist layer 30 can include, among others, a matrix material or resin, a sensitizer or inhibitor, and a solvent. Photoresist layer 30 is preferably a chemically amplified, positive or negative tone, organic-based photoresist. Photoresist layer 30 may be, but is not limited to, an acrylate-based polymer, an alicyclic-based polymer, or a phenolic-based polymer. For example, photoresist layer 30 may comprise PAR700 photoresist manufactured by Sumitomo Chemical Company. Photoresist layer 30 is deposited, for example, by spin-coating over layer 28. Photoresist layer 30 is provided at a thickness of less than 1.0 $\mu$m.

Chamber 12 of lithographic system 10 can be a vacuum or low pressure chamber for use in ultraviolet (UV), vacuum ultraviolet (VUV), deep ultraviolet (DUV), extreme ultraviolet (EUV), x-ray, or other types of lithography. Chamber 12 can contain any of numerous types of atmospheres, such as, nitrogen, etc. Alternatively, chamber 12 can be configured to provide a variety of other patterning scheme.

Light source 14 provides light or electromagnetic radiation through condenser lens assembly 16, mask or reticle 18, and objective lens assembly 20 to photoresist layer 30. Light source 14 is an excimer laser, in one embodiment, having a wavelength of 365 nm, 248 nm, 193 nm, 157 nm, or 126 nm, or a soft x-ray source having a wavelength at 13.4 nm. Alternatively, light source 14 may be a variety of other light sources capable of emitting radiation having a wavelength in the ultraviolet (UV), vacuum ultraviolet (VUV), deep ultraviolet (DUV), extreme ultraviolet (EUV), x-ray or other wavelength range.

Assemblies 16 and 20 include lenses, mirrors, collimators, beam splitters, and/or other optical components to suitably focus and direct a pattern of radiation (i.e., radiation from light source 14 as modified by a pattern or image provided on mask or reticle 18) onto photoresist layer 30. Stage 22 supports wafer 24 and can move wafer 24 relative to assembly 20.

Mask or reticle 18 is a binary mask in one embodiment. Mask or reticle 18 includes a translucent substrate 32 (e.g., glass or quartz) and an opaque or absorbing layer 34 (e.g., chromium or chromium oxide) thereof. Absorbing layer 34 provides a pattern or image associated with a desired circuit pattern, features, or devices to be projected onto photoresist layer 30. Alternatively, mask or reticle 18 may be an attenuating phase shift mask, an alternating phase shift mask, or other type of mask or reticle.

Figure 3:
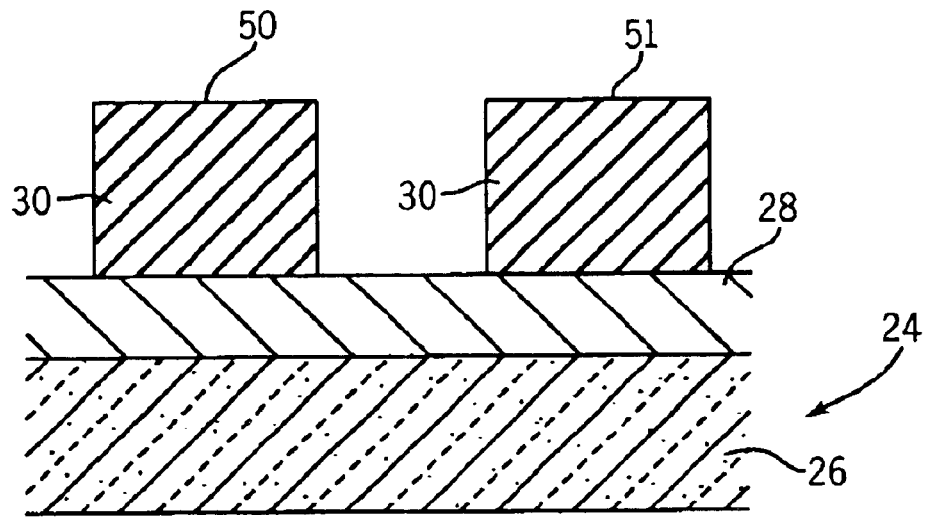
FIG. 3 is a cross-sectional view of the wafer illustrated in FIG. 2, showing a developing step.

Utilizing lithographic system 10, the pattern or image on mask or reticle 18 is projected onto and patterned on photoresist layer 30 of wafer 24. Next, in developing step 42, wafer 24 is exposed to a developer, as is well-known in the art, to develop the pattern on photoresist layer 30. Referring to FIG. 3, a cross-sectional view of a portion of wafer 24 after developing step 42 is shown. The developed pattern includes features 50 and 51.

After photoresist layer 30 has been developed but before features thereon are transferred onto any of the underlying layers, such as layer 28, electron beam exposure step 44 is performed. Wafer 24 may be removed from chamber 12 and placed within a different chamber and/or a different environment which provides electron beam tools. Alternatively, chamber 12 may be configured to include additional chambers and/or tools suitable to perform step 44.

Figure 4:
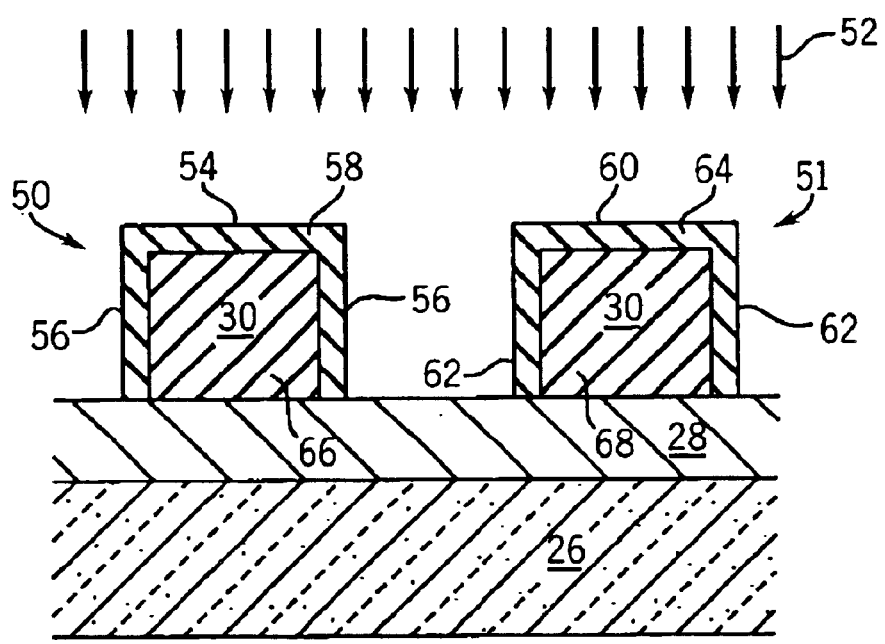
FIG. 4 is a cross-sectional view of the wafer illustrated in FIG. 3, showing an electron beam exposure step.

In FIG. 4, there is shown wafer 24 undergoing electron beam exposure step 44. A flood electron beam 52 impinges on the exposed surfaces of wafer 24 and chemically transforms or modifies such exposed surfaces to a certain depth. For feature 50, a top surface or region 54 and sidewalls or side regions 56 are transformed into a shell 58. Similarly, for feature 51, a top surface or region 60 and sidewalls or side regions 62 are transformed into a shell 64. Hence, upon completion of step 44, feature 50 will comprise an untreated region 66 and shell 58, untreated region 66 being encapsulated from underneath by layer 28 and on all other sides or faces by shell 58. Similarly, feature 51 will comprise an untreated region 68 and shell 64, untreated region 68 being encapsulated from underneath by layer 28 and on all other sides or faces by shell 64.

Electron beam 52 is preferably emitted from an extended area electron source (not shown) and is a uniform collimated beam that is flood exposed over the entire wafer 24 at a normal angle of incidence. The extended area electron source is of the cold cathode type and generates electron beam 52 from the energetic impact of ions against a suitable metal. An example of an extended area electron source suitable to generate electron beam 52 is manufactured by Electron Vision Corporation.

The electron beam flood exposure conditions (e.g., beam current, dose, and accelerating voltage) are selected such that layer 30 will not melt and flow, which will cause distortions in features 50, 51. Instead, conditions are selected to cause molecules of layer 30 which interact with electron beam 52 to undergo a chemical change, i.e., cross-linking, to the extent that the functional groups of the polymer material comprising such molecules will become decomposed. Shells 58 and 64 are representative of the decomposed regions of layer 30. The portions of features 50, 51 that electron beam 52 are unable to penetrate or bombard, i.e., untreated regions 66, 68, remain unaffected (i.e., the polymer functional groups of untreated regions 66, 68 are not cross-linked to the point of complete decomposition).

The degree of decomposition that the functional groups of the polymer material comprising layer 30 will undergo is a function of the dose of electron beam 52. In one embodiment, electron beam 52 is provided at a beam current in the order of approximately 3 mA, a dose in the range of approximately 500 to 4000 $\mu C/cm^2$, and preferably, at approximately 2000 $\mu C/cm^2$, and an accelerating voltage of approximately 3–5 keV. The conditions are selected to form shells 58, 64 configured to suitably address the charging and outgassing problems associated with SEM analysis and inspection. Alternatively, when layer 30 comprises other types of materials, the beam current and dosage of electron beam 52 may be selected to cause desirable chemical changes such that the changed portions of layer 30 will facilitate obtaining accurate CD measurements, as will be described in greater detail below.

The penetration depth of electron beam 52 into layer 30 is a function of the energy of electron beam 52. The penetration depth also determines the depth or thickness of each of shells 58, 64. In one embodiment, the depth of shells 58, 64 can be selected as a function of the accelerating voltage of electron beam 52 and this relationship can be approximately expressed as:

$$R_g = \frac{0.046 V_a^{1.75}}{d}$$

where $R_g$ is the penetration depth in microns, $V_a$ is the accelerating voltage or energy in keV, and d is the density of the target material (e.g., layer 30) in g/cm$^3$. Preferably, the accelerating voltage of electron beam 52 is provided at up to approximately 10 keV. More preferably, the accelerating voltage is in the range of approximately 3–5 keV.

In any case, the depth of shells 58, 64 is selected in accordance with the performance or conditions associated with the SEM analysis and inspection carried out in step 46. In one embodiment, the depth of shells 58, 64 is in the range of approximately 30 to 200 Å, and more preferably, is up to 50 to 60 Å thick.

In step 46, SEM images of the patterned features on layer 30 are generated using an SEM analysis and inspection tool 100 (FIG. 5), to obtain CD measurements of such patterned features (e.g., to measure the lateral dimensions of features 50 and 51) before they are transferred onto underlying layers (e.g., layer 28) of wafer 24.

Tool 100 includes a chamber 102, an electron gun 104, an optical assembly 106, detectors 108, a computer or analyzer 110, and a stage 112. Although not shown, tool 100 may further include other components, such as, filters, analogto-digital (A/D) converters, amplifiers, input/output devices, controllers, storage devices, etc.

In one embodiment, chamber 102 is maintained under vacuum at a pressure of approximately $10^{-7}$ Torr. Electrons are emitted from electron gun 104 and configured into primary electrons 114 by optical assembly 106. Optical assembly 106 may be one or more lens assemblies, and may include lenses, filters, beam splitters, mirrors, etc., which generate a focused and collimated primary electrons 114. Primary electrons 114 impinge on wafer 24, and in particular, on layer 30. Tool 100 preferably images a portion of wafer 24 at any given time and as such, wafer 24 may be provided over stage 112 for translation. Alternatively, wafer 24 may be stationary and tool 100 may move during step 46.

Figure 5:
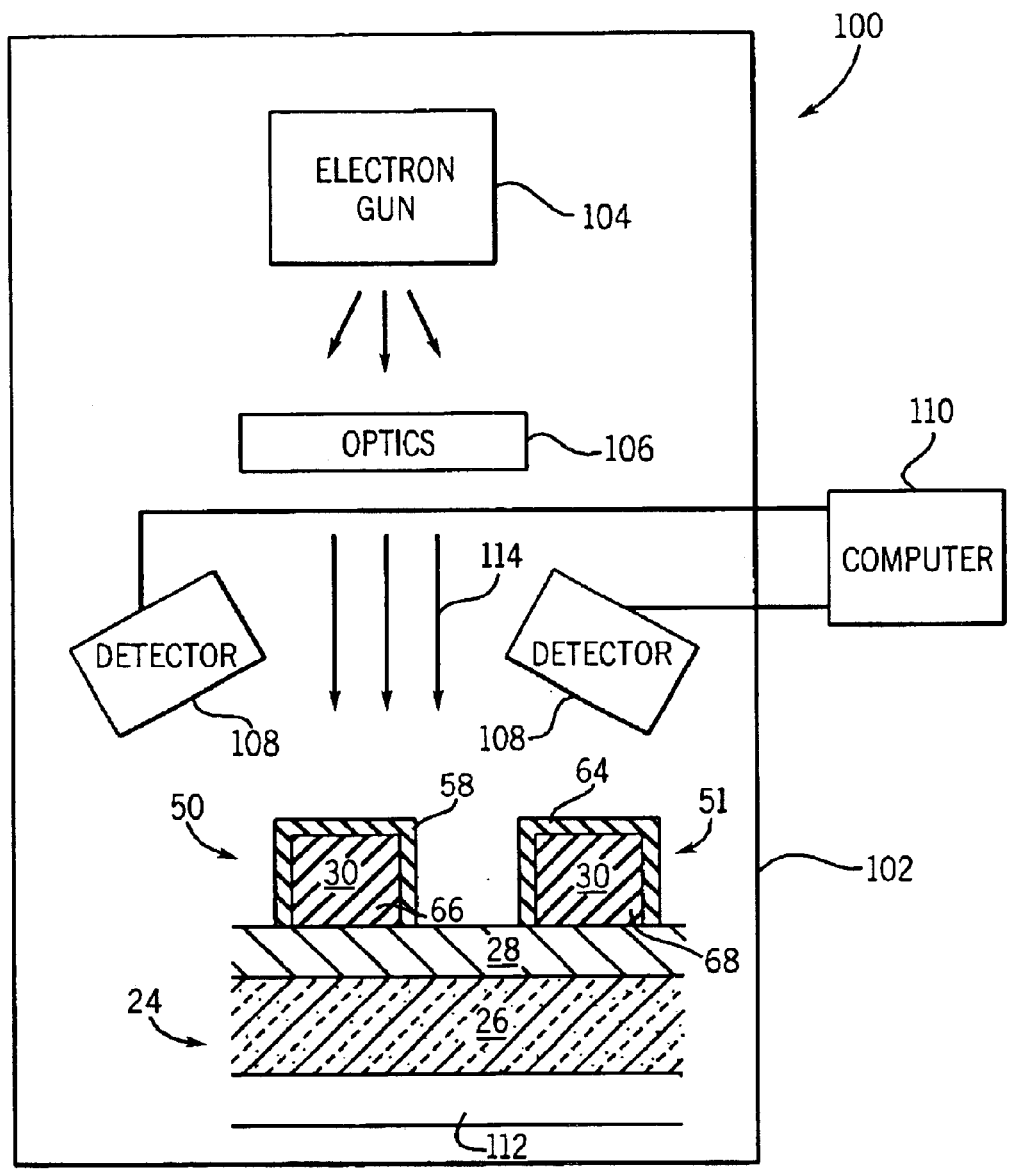
FIG. 5 is a scanning electron microscope (SEM) analysis and inspection tool in accordance with an exemplary embodiment.

The interaction of primary electrons 114 with layer 30 causes secondary electrons (not shown) to be emitted from layer 30. The secondary electrons are collected by detectors 108 and electrical signals representative thereto are communicated to computer 110 for processing and analysis. Although two detectors 108 are shown in FIG. 5, detectors 108 may comprise one or more detectors that are suitably positioned relative to wafer 24 to receive the secondary electrons. Detectors 108 can be photomultiplier detectors. Computer 110 utilizes the electrical signals from detectors 108 to generate SEM images of the surface of wafer 24, i.e., the patterned features on layer 30. Such SEM images are then inspected, either by a human operator or through an automated process, to obtain CD measurements associated with the patterned features on layer 30 (e.g., the lateral dimensions of features 50 and 51) (step 48).

Ideally, primary electrons 114 should penetrate layer 30 up to a certain depth and only secondary electrons should be emitted from layer 30. Otherwise, primary electrons 114 should have no other interaction with or impact on wafer 24. In reality, SEM imaging causes, among others, a charge to build up in layer 30 and/or outgassing of volatile species from layer 30, resulting in SEM images with degraded image contrast and this, in turn, leading to erroneous CD measurements. Moreover, the heating and charging occurring in layer 30, if severe enough, can cause the patterned features to become permanently distorted. The electron beam treatment of step 44 advantageously minimizes or eliminates such problems.

The cross-linked regions (e.g., shells 58, 64) of layer 30 have different structural or material properties relative to the non-cross-linked regions (e.g., untreated regions 66, 68) of layer 30. Among others, the cross-linked regions are more dense, less porous, and are harder or stiffer than the none cross-linked regions. When the depth of shells 58, 64 is selected to be equal to or greater than the penetration depth of primary electrons 114, the secondary electrons emitted from features 50, 51 are predominantly from shells 58, 64 (as opposed to untreated regions 66, 68). Because of the specific properties of shells 58, 64, they will not outgas volatile organic species upon interaction with primary electrons 114. Moreover, since primary electrons 114 will have little or no interaction with untreated regions 66, 68, outgassing of volatile organic species from untreated regions 66, 68 is also minimized or eliminated.

When the depth of shells 58, 64 is selected to be less than the penetration depth of primary electrons 114, the secondary electrons are emitted from both shells 58, 64 and untreated regions 66, 68 for features 50, 51, respectively. Advantageously, volatile organic species which would otherwise be outgassed from untreated regions 66, 68 into chamber 102 are trapped within layer 30 by shells 58, 64. Hence, shells 58, 64 are configured with respect to the operating conditions of tool 100 and the characteristics of the material comprising layer 30 (e.g., an organic-based photoresist material) such that outgassing of volatile organic species from layer 30 into chamber 102 is prevented by the trapping or barrier capability of shells 58, 64. If Volatile organic species were to escape layer 30, they would interact with and scatter primary electrons 114, resulting in SEM images with poor contrast and poor CD measurement accuracy. Examples of volatile organic species include isobutene, benzylic photoacid generator fragments, etc.

Shells 58, 64 also have different optical and electrical properties relative to untreated regions 66, 68. The constituent material elements comprising untreated regions 66, 68 (e.g., residual solvent, photoresist additives, etc.) have different electrical properties relative to each other which can impede smooth dissipation of the beam current associated with SEM imaging, leading to a charge build up in features 50, 51. In contrast, the electrical and optical properties of shells 58, 64 are more uniform than those of untreated regions 66, 68. Hence, not only are shells 58, 64 less likely to build up a charge, their uniform or homogeneous electrical properties also promote smooth dissipation of any built-up charge. This results in SEM images without degraded image contrast and also reduces distortions or damage to features 50, 51, which may occur with significant charging and/or heating problems.

It should be understood that SEM tool 100 as shown in FIG. 5 and described herein are for illustration purposes only and are not meant to be limiting. SEM tool 100 may be configured in a variety of other ways to perform a desired inspection of features patterned on layer 30 after development but before pattern transfer to underlying layers.

Once SEM imaging data have been obtained via detectors 108, such data are analyzed and processed, as is well-known in the art, by computer 110 in step 48 to generate CD measurements that actually represent the lateral dimensions of features on layer 30.

In this manner, charging, heating, and/or outgassing problems associated with SEM inspection of features patterned on a photoresist layer during IC fabrication can be significantly reduced or even eliminated. An electron beam treatment of the photoresist layer to modify its outer surfaces to a certain depth leads to the formation of a shell or barrier for each feature patterned on the photoresist layer. These shells prevent the outgassing of species which may scatter and interact with the SEM's electron beam and provide a region for smoothly dissipating built-up charge or heat from the SEM's electron beam. The resulting SEM images no longer suffer from image contrast problems and ultimately the CD measurements obtained therefrom will be highly accurate. The patterned features are also less likely to become permanently distorted or damaged as a consequence of undergoing SEM inspection. In one embodiment, charging, heating, and/or outgassing problems typically associated with SEM inspection of organic-based photoresist layer may be reduced by 95% or better.

It is understood that although the detailed drawings, specific examples, and particular values describe the exemplary embodiments of the present invention, they are for purposes of illustration only. The exemplary embodiments of the invention are not limited to the precise details and descriptions described herein. For example, although particular materials or chemistries are describes, other materials or chemistries can be utilized. Various modifications may be made if the details disclosed without departing from the spirit of the invention as defined in the following claims.

What is claimed is:

1. A method of inspecting a surface associated with manufacture of an integrated circuit, the method comprising the steps of:
   providing an electron beam to the surface;
   transforming at least a portion of the surface; and
   inspecting the surface using a scanning electron microscope (SEM), wherein the transforming step occurs before the inspecting step, wherein the surface includes at least one patterned feature having a top portion, side portions, and a bottom portion, and the transforming step includes chemically changing the top portion and the side portions to form a shell that encapsulates the bottom portion.

2. The method of claim 1, wherein the electron beam is a flood electron beam.

3. The method of claim 2, wherein the shell has a depth in the range of approximately 30 to 200 Å.

4. The method of claim 2, wherein the surface is an organic-based photoresist layer.

5. The method of claim 4, wherein the transforming step includes decomposing polymer functional groups included in the top and the side portions.

6. The method of claim 1, wherein the inspecting step includes at least one of preventing volatile species from leaving the surface and substantially dissipating a charge built up in the surface.

7. A patterned photoresist layer configured to facilitate accurate critical dimension measurements of features thereon using a scanning electron microscope (SEM), the layer comprising:
   a treated region; and
   an untreated region, wherein the treated region comprises a top surface and side surfaces surrounding the untreated region, and the treated region having at least one of a different electrical and material property relative to the untreated region.

8. The layer of claim 7, wherein the material comprising the patterned photoresist layer is an organic-based polymer.

9. The layer of claim 7, wherein the treated region is formed by flood exposing the patterned photoresist layer to an electron beam.

10. The layer of claim 9, wherein the electron beam has a beam current of approximately 3 mA, a dose in the range of approximately 500–4000 $\mu C/cm^2$, and an accelerating voltage up to approximately 10 keV.

11. The layer of claim 9, wherein the electron beam has a dose of approximately 2000 $\mu C/cm^2$ and an accelerating voltage in the range of approximately 3–5 keV.

12. The layer of claim 9, wherein the electron beam cross-links and decomposes polymer functional groups included in the material comprising the treated region.

13. The layer of claim 7, wherein the treated region has a thickness of approximately 30 to 200 Å.

14. The layer of claim 7, wherein the treated region is configured to prevent outgassing species generated by the untreated region from coming into contact with the SEM.

15. The layer of claim 7, wherein the treated region is configured to dissipate a charge generated in the patterned photoresist layer in association with the use of the SEM.

16. A process for reducing the build up of at least one of charge, heat, and volatile species in a photoresist layer during scanning electron microscope (SEM) inspection, the process comprising:
   exposing the photoresist layer to a flood electron beam, the photoresist layer including at least one patterned feature having a top surface, side surfaces, and an untreated portion; and
   forming a shell in the photoresist layer in response to the flood electron beam, wherein the shell is comprised of the top surface and the side surfaces, and the shell reduces the build up of at least one of charge, heat, and volatile species associated with the at least one feature during SEM inspection.

17. The process of claim 16, wherein the exposing step includes exposing the flood electron beam having operating conditions of approximately 3 mA, 500–4000 $\mu C/cm^2$, and up to 10 keV.

18. The process of claim 16, wherein the shell surrounds the untreated portion and a thickness of the shell is approximately 30–200 Å.

19. The process of claim 16, wherein the forming step includes cross-linking the top surface and the side surfaces to form the shell.

20. The process of claim 16, wherein the forming step includes decomposing the functional groups included in the top surface and the side surfaces to form the shell.

* * * * *